US011296713B1

(12) United States Patent
Ramezani et al.

(10) Patent No.: US 11,296,713 B1
(45) Date of Patent: Apr. 5, 2022

(54) CIRCUITRY FOR EVENT-DRIVEN DATA ACQUISITION

(71) Applicant: Pacific MicroCHIP Corp., Culver City, CA (US)

(72) Inventors: Reza Ramezani, Encino, CA (US); Anton Karnitski, Culver City, CA (US); Gytis Baranauskas, Rancho Palos Verdes, CA (US); Dalius Baranauskas, Pacific Palisades, CA (US); Denis Zelenin, Brentwood, CA (US)

(73) Assignee: Pacific MicroCHIP Corp., Culver City, CA (US)

( * ) Notice: Subject to any disclaimer, the term of this patent is extended or adjusted under 35 U.S.C. 154(b) by 0 days.

(21) Appl. No.: 17/121,728

(22) Filed: Dec. 14, 2020

Related U.S. Application Data (60) Provisional application No. 63/063,775, filed on Aug. 10, 2020.

(51) Int. Cl.
*H03M 1/48* (2006.01)
*H03M 1/00* (2006.01)
*H03M 1/40* (2006.01)
*H03M 1/12* (2006.01)

(52) U.S. Cl.
CPC ........... *H03M 1/002* (2013.01); *H03M 1/007* (2013.01); *H03M 1/122* (2013.01); *H03M 1/125* (2013.01); *H03M 1/406* (2013.01)

(58) Field of Classification Search
CPC ............ H03M 1/12; H03M 7/30; H03M 1/00; H03M 7/3059; H03M 1/122; H03M 1/1245; H03M 7/3062; H03M 1/0639; H03M 1/502; H03M 1/742; H03M 1/0624; H03M 1/127; H03M 1/1033
USPC .......................................... 341/115, 118, 120
See application file for complete search history.

(56) References Cited

U.S. PATENT DOCUMENTS

| | | | | |
|---|---|---|---|---|
| 6,121,799 A | * | 9/2000 | Moser | G06J 1/00 327/58 |
| 8,312,660 B1 | * | 11/2012 | Fujisaki | F41A 17/08 42/70.11 |
| 9,106,394 B1 | * | 8/2015 | Kennedy | F42B 35/00 |
| 2006/0212273 A1 | * | 9/2006 | Krausman | A61B 5/411 702/189 |
| 2007/0090888 A1 | * | 4/2007 | Kim | H03K 3/0322 331/57 |
| 2007/0279274 A1 | * | 12/2007 | Hsieh | H03M 1/1225 341/155 |
| 2009/0224158 A1 | * | 9/2009 | Haselman | G01T 1/1647 250/363.02 |

(Continued)

*Primary Examiner* — Linh V Nguyen
(74) *Attorney, Agent, or Firm* — Rutan & Tucker, LLP (57) ABSTRACT

A system and method for detection of an event and recording data associated with the event. An application-specific integrated circuit (ASIC) for event-driven data acquisition from detector is disclosed. The event-driven circuitry stays silent when there is no event detected on the detector. The event-driven data acquisition system consumes small power and may consume no memory during waiting for an event. Once the event arrives (e.g. photons, particle or ion hits the detector panel), the event is detected and recorded. The ASIC includes multi-channel ADCs (or ADC arrays) with flexible resolution which enables an option to operate at a lower resolution during the silent period to save power.

20 Claims, 10 Drawing Sheets

(56) References Cited

U.S. PATENT DOCUMENTS

| | | | |
|---|---|---|---|
| 2012/0268105 A1* | 10/2012 | Mann | G01T 1/17 |
| | | | 324/120 |
| 2018/0055406 A1* | 3/2018 | Mandal | G01R 33/4808 |
| 2019/0027935 A1* | 1/2019 | Maleka | G01R 19/2506 |
| 2019/0336083 A1* | 11/2019 | Gill | A61B 5/361 |
| 2019/0386485 A1* | 12/2019 | Hao | H02H 7/26 |

\* cited by examiner

| [123] | PARITY |
| [122] | EVENT DECLARATION |
| [121:109] | WINDOW INTERVAL |
| [108:104] | ADC CHANNEL ID |
| [103:56] | TOA (TIME OF ARRIVAL) |
| [55:44] | TOP (TIME OF PEAK) |
| [43:32] | TOT (TIME OVER THRESHOLD) |
| [31:20] | PEAK VALUE |
| [19:8] | CHANNEL THRESHOLD |
| [7:6] | CHANNEL FIFO USAGE |
| [5:0] | SHARED FIFO USAGE |

CIRCUITRY FOR EVENT-DRIVEN DATA ACQUISITION

CROSS-REFERENCE TO RELATED APPLICATIONS

This application is claims the benefit of priority on U.S. Provisional Application No. 63/063,775 filed Aug. 10, 2020, the entire contents of which are incorporated by reference.

FIELD

Embodiments of the disclosure relate to a system and method for detection of an event and recording data associated with the event arising from photon, particle or ion interaction with a detector. More specifically, one embodiment of the disclosure relates to an application specific integrated circuit (ASIC) employing a multi-channel, analog-to-digital converter (ADC) for event-driven data acquisition from one or more detectors that detect events.

GENERAL BACKGROUND

A variety of systems designed for acquisition and processing of data provided by an event detected by a detector. Examples include, but not limited to, photon detection using Large Area Picosecond Photodetector (LAPPD) panels. Having application in fields such as high energy physics, nuclear physics, medical imaging, and other industries in which light capture may be used for imaging, conventional detection and recordation systems are implemented with either a digital signal processor or a Field Programmable Gate Arrays (FPGA), which is coupled to an analog-to-digital converters (ADC) that receives and processes event-related signals originated at the detector. However, conventional detection and recordation systems suffer from a number of disadvantages.

First, conventional detection and recordation systems are consuming a large amount of power as these systems are continuously operating while waiting for an event-related signal to arrive. During such operations, the systems continue to use memory that may be filled with zero (null) data that is not representative of any detected event. Second, the conventional detection and recordation systems are quite large (e.g., electronics for photon detection from LAPPD panel occupies area of 25 cm×24 cm) and require large amount of data to be transferred between the ADC array and the FPGA (communication data rate of 24.96 gigabits per second (Gbps)).

To address the disadvantages associated with conventional detection and recordation systems, an efficient event-driven ASIC-based data acquisition system is described below, which is configured to store data from detections and refrain from storing null data. As a result, the disclosed system consumes less power and a greater level of resources may be preserved. Once the photon, particle or ion interacts with a detector, such as a LAPPD panel for example, the event is detected and recorded.

BRIEF DESCRIPTION OF THE DRAWINGS

The present disclosure is illustrated by way of example, and not limitation, in the figures of the accompanying drawings, in which like reference numerals indicate similar elements and in which.

DETAILED DESCRIPTION

Embodiments of circuitry for event-driven data acquisition are described herein, where the event-driven circuitry may be implemented as an application-specific integrated circuit (ASIC). Before any particular embodiments are disclosed in detail, however, it should be understood that the particular embodiments disclosed herein do not limit the scope of the concepts provided herein. It should also be understood that a particular embodiment disclosed herein can have features that can be readily separated from the particular embodiment and optionally combined with or substituted for features of any of a number of other embodiments disclosed herein.

Regarding terms used herein, it should also be understood the terms are for the purpose of describing some particular embodiments, and the terms do not limit the scope of the concepts provided herein. Ordinal numbers (e.g., first, second, third, etc.) are generally used to distinguish or identify different features or steps in a group of features or steps, and do not supply a serial or numerical limitation. For example, "first," "second," and "third" features or steps need not necessarily appear in that order, and the particular embodiments including such features or steps need not necessarily be limited to the three features or steps. Labels such as "left," "right," "top," "bottom," "front," "back," "middle" and the like are used for convenience and are not intended to imply, for example, any particular fixed location, orientation, or direction. Instead, such labels are used to reflect, for example, relative location, orientation, or directions. Singular forms of "a," "an," and "the" include plural references unless the context clearly dictates otherwise. Also, the words "including," "has," and "having," as used herein, including the claims, shall have the same meaning as the word "comprising."

In the following description, certain terminology is used to describe features of the invention. In certain situations, the terms "logic," "unit," and "component" may be representative of hardware, software or a combination thereof, which is configured to perform one or more functions. As hardware, the logic (or unit or component) may include circuitry having data processing or storage functionality. Examples of such circuitry may include, but are not limited or restricted to any type of circuitry that operates on analog or digital signals such as one or more analog-to-digital converters, data storage (e.g., FIFOs), comparators, transmitters, combinatorial gates, or the like.

Alternatively, or in combination with the hardware circuitry described above, the logic (or unit or component) may be software in the form of one or more software modules. The software module(s) may include an executable application, an application programming interface (API), a subroutine, a function, a procedure, an applet, a servlet, a routine, source code, a shared library/dynamic load library, or one or more instructions. The software module(s) may be stored in any type of a suitable non-transitory storage medium, or transitory storage medium (e.g., electrical, optical, acoustical or other form of propagated signals such as carrier waves, infrared signals, or digital signals). Examples of non-transitory storage medium may include, but are not limited or restricted to a programmable circuit; a semiconductor memory; non-persistent storage such as volatile memory (e.g., any type of random access memory "RAM"); persistent storage such as non-volatile memory (e.g., read-only memory "ROM", power-backed RAM, flash memory, phase-change memory, etc.), a solid-state drive, hard disk drive, an optical disc drive, or a portable memory device.

Lastly, in the following description, the terms "or" and "and/or" as used herein are to be interpreted as inclusive or meaning any one or any combination. As an example, "A, B or C" or "A, B and/or C" mean "any of the following: A; B; C; A and B; A and C; B and C; A, B and C." An exception to this definition will occur only when a combination of elements, components, functions, steps or acts are in some way inherently mutually exclusive.

Unless defined otherwise, all technical and scientific terms used herein have the same meaning as commonly understood by those of ordinary skill in the art.

Embodiments disclosed herein are directed to circuitry for event-driven data acquisition from one or more detectors. According to one embodiment of the disclosure, the circuitry may be deployed as an application-specific integrated circuit (ASIC). Herein, for this embodiment, an event-driven (ASIC) circuitry refrains from storing null data (e.g., data that is not based on detected event such as detected photons). As a result, this event-driven circuitry consumes a small amount of power and consumes no memory during a time period when no event are detected (hereinafter, "silent period"). Once an event is arrived (e.g. a photon hits the LAPPD panel), the event is detected and recorded. The event-driven circuitry may include a multi-channel ADC with flexible resolution, which enables an option to operate at a lower resolution during the silent period to save power.

According to one embodiment of the disclosure, deployed as an ASIC, the event-driven circuitry supports thirty-two (32) data acquisition channels and is communicatively coupled to a backend digital engine for data processing, event generation and data storage. In one embodiment, the event-driven circuitry may employ ADC with successive-approximation-register (SAR) architecture and an embedded calibration mode. The event-driven circuitry may further include a clock generator for auto adjusting of the clock to produce sampling and conversion timing.

Figure 1A:
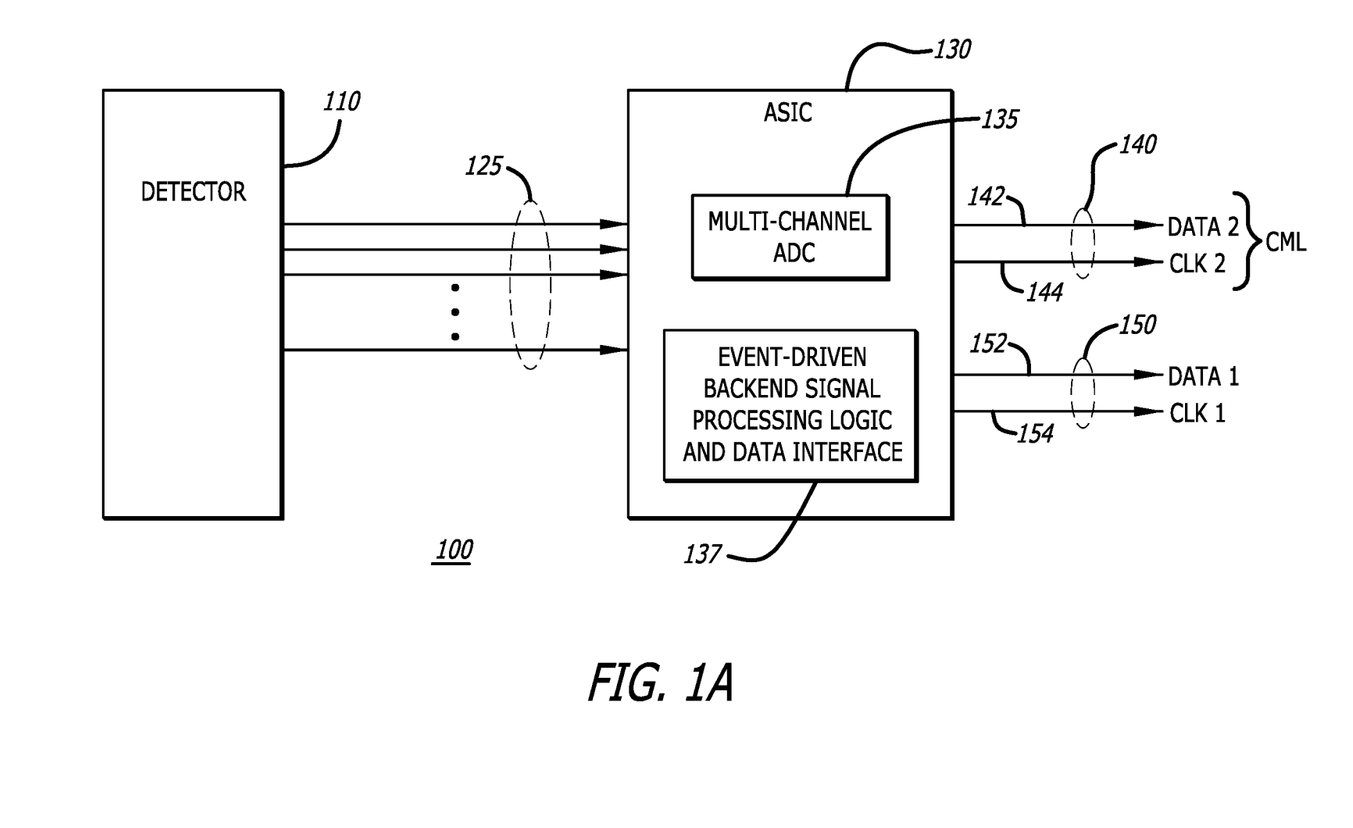
FIG. 1A is an exemplary block diagram of an event-driven data acquisition environment.

Referring to FIG. 1A, an exemplary block diagram of an event-driven data acquisition environment 100 is shown. Herein, a detector 110 may be configured to register an event in response to a photon, particle, ion or any other element (generally referred to as an "element") interacting with the detector 110. Examples of different types of detectors may include, but is not limited or restricted to particle detectors, photon detectors, ion detectors or the like. Particle detectors may be used in liquid monitoring (e.g., oil/gas industry applications, automotive applications). Photon and/or ion detectors may be directed to certain (targeted) elements (e.g., chemicals, molecules, etc.) in a variety of industries such as in the biomedical industry.

Upon detection of an event (e.g., a photon hit, detected particle of a predetermined size, etc.), the detector 110 generates signals 125, which are provided to circuitry 130 for event-driven data acquisition (hereinafter, "event-driven circuitry"). According to one embodiment of the disclosure, the event-driven circuitry 130 constitutes an integrated circuit, such as an application specific integrated circuit (ASIC) for example.

Herein, as shown in FIG. 1A, the event-driven circuitry 130 includes a multi-channel (N-channel) analog-to-digital converter (ADC) 135 and an event-driven backend signal processing logic and data interface 137. The event-driven circuitry (e.g., ASIC) 130 is highly configurable, low power, and compact in size. Through high precision electronic components, as described below, the ADC 135 and backend circuitry 137 of the ASIC 130 are configured to detect, analyze, store and transmit data associated with the detected events. The transmission may be provided in accordance with multiple data formats.

Figure 1B:
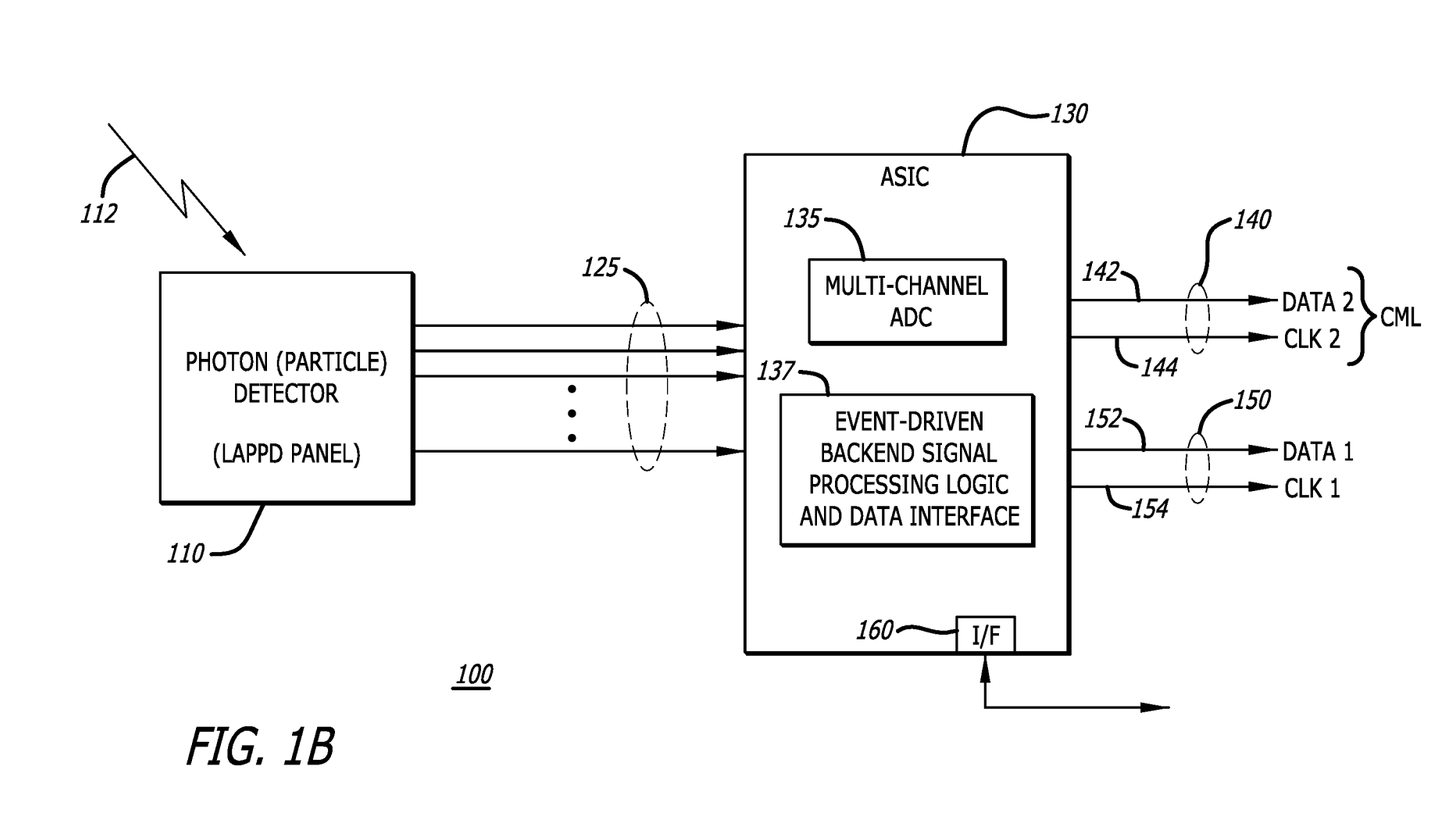
FIG. 1B is a more detailed block diagram of the event-driven data acquisition environment, in accordance with an exemplary embodiment.

Referring to FIG. 1B, a more detailed block diagram of the exemplary event-driven data acquisition environment 100 of FIG. 1A is shown. Those skilled in the art would understand that FIG. 1B represents one schematic example of a data acquisition environment and other embodiments may use different arrangements. Herein, the detector 110 is configured to detect signals produce by elements 112 that come into contact with the detector 110. As discussed above, the detector 110 may be implemented to include one or more Large Area Picosecond Photodetectors (LAPPDs) referred to as a "LAPPD panel." Upon detection of an element, such as a photon hit for example, the detector 110 generates signals 125, which represent a position of the detected photon at a location of contact on the detector 110 and its intensity.

As shown in both FIG. 1A and FIG. 1B, signals (IN-POS and IN-Nc) 125 are passed to circuitry 130 for event-driven data acquisition (hereinafter, "event-driven circuitry"). According to one embodiment of the disclosure, the event-driven circuitry 130 includes a differential, analog-to-digital converter (ADC) 135, which provides improved noise rejection and increases applicability to a wider range of product applications as differential ADCs can be used to support single-ended input signals or differential input signals as represented by the signals 125.

Figure 2A:
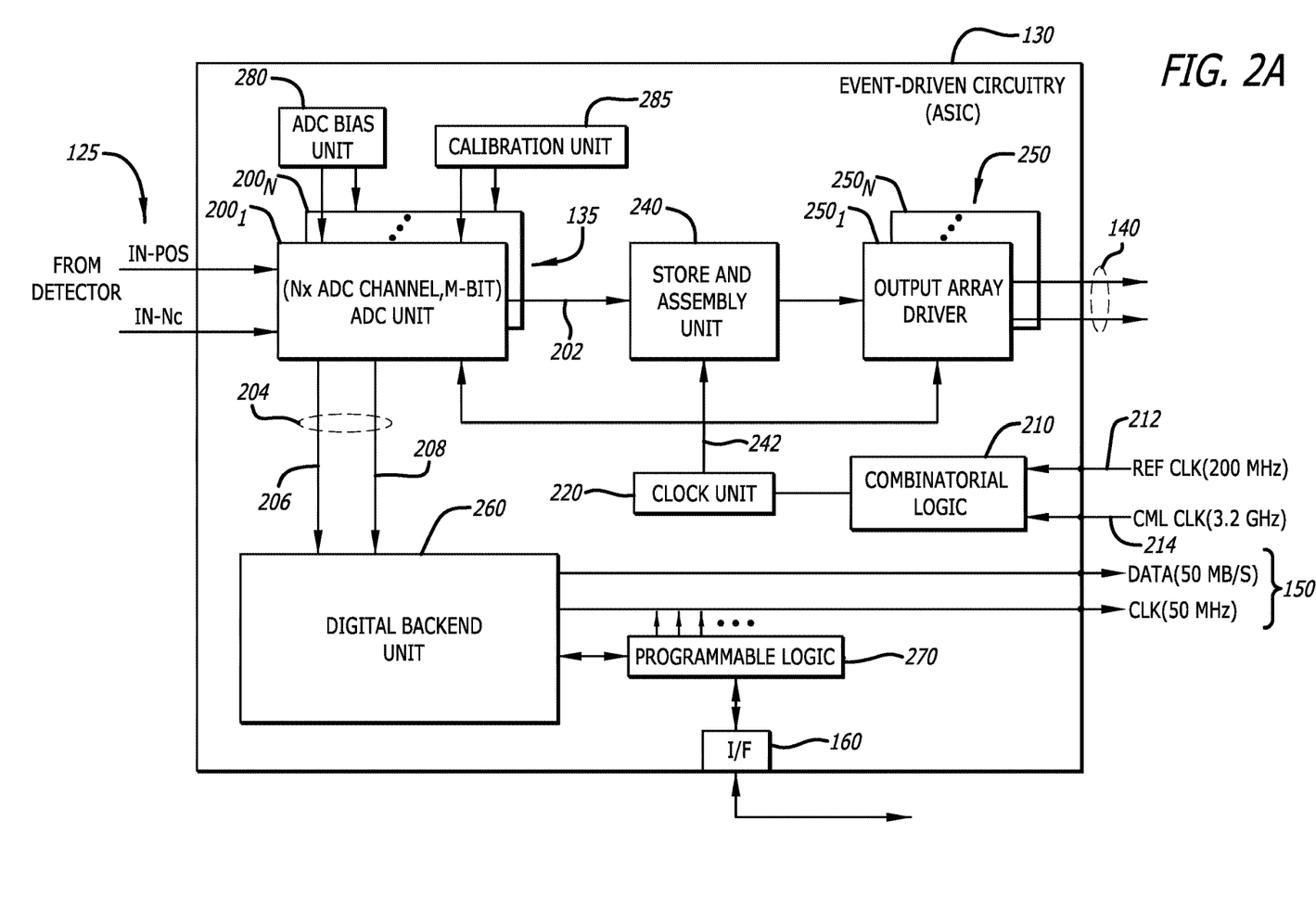
FIG. 2A is a detailed block diagram of the event-driven circuitry deployed within the event-driven acquisition environment of FIG. 1A or FIG. 1B and provided by an ASIC, in accordance with an exemplary embodiment.

Herein, the event-driven circuitry 130 includes a multi-channel (N-channel) ADC 135, which includes a plurality of m-bit, analog-to-digital converter (ADC) units $200_1$-$200_N$ as shown in FIG. 2A, where "m" is greater than or equal to eight (e.g., m=12) for this embodiment. Herein, the ADC 135 is configured with a plurality of acquisition channels, such as thirty-two (e.g., N=32) acquisition channels for example. Each acquisition channel is associated with a corresponding ADC unit, which is operating within the same frequency range (e.g., within $1^{st}$ Nyquist zone) to sample the input signals 125 and convert the sampled input signals 125 into digital data (e.g., m-bit packets). Herein, the event-driven circuitry 130 provide two separate outputs 140 and 150, depending on intended usage of the output data.

More specifically, according to one embodiment of the disclosure as shown in FIG. 1A or FIG. 1B, the event-driven circuitry 130 is configured to generate a first set of outputs 150, which includes data (DATA1 152) that is being produced at a first data rate and a clocking signal (CLK1 154) at a first clock frequency. The output 150 relies on data processing within the event-driven circuitry 130 in which portions of the data associated with detected event is output at the first data rate. For example, as an illustrative embodiment, the first data rate may correspond to fifty (50) megabits per second (Mbps) and the first clock frequency may correspond to fifty (50) megahertz (MHz).

Additionally, the event-driven circuitry 130 may be configured to generate a second set of outputs 140, namely current mode logic (CML) output 140 voltages and frequency. As shown, the second set of outputs 140 is provided data (DATA2 142) at a second data rate (e.g., 6.4 Gbps) and a clocking signal (CLK2 144) at a second clock frequency (e.g., 3.2 gigahertz "GHz"), where the second data rate is substantially greater than the first date rate. One reason that the second data rate is substantially greater than the first data rate is due to the fact that the CML 140 may provide the data and clocking frequency to another data processing system. In particular, the CIVIL output 140 may be used to gather all data associated with the detector 110, where additional digital signal processing may be performed on this data downstream from the event-driven circuitry 130.

The event-driven circuitry 130 is further configured with an interface 160 to receive information for programming its operability. For example, via the interface 160, a sampling frequency of the event-driven circuitry 130 may be adjusted through an adjustment of on-chip registers. The adjustment of the sampling frequency may be utilized to maintain system performance consistency and control operability of a number of components within the event-driven circuitry 130 as described below.

Referring now to FIG. 2A, a block diagram of an exemplary event-driven circuitry 130 is shown. Those skilled in the art would understand that FIG. 2A represents one schematic example of the exemplary event-driven circuitry 130 and other embodiments may use different arrangements.

As discussed above with reference to FIGS. 1A-1B, a multi-channel (N-channel) ADC 135 includes ADC units $200_1$-$200_N$, where each ADC unit $200_1$, . . . , or $200_N$ samples the signal 125 and performs digital conversion of the input signal 125. Each of the ADC units $200_1$-$200_N$ may be calibrated by a calibration unit 285. Calibration may be performed by a set of algorithms implemented in hardware to compensate the fabrication non-idealities.

Each of the ADC units $200_1$-$200_N$ may be biased by an ADC bias unit 280. The ADC bias unit 280 may provide biasing voltage and current. In other words, the ADC bias unit 280 may provide required reference voltages or currents for each of the ADC units $200_1$-$200_N$ to function. In one embodiment, the multi-channel ADC 135 provides digital data to a storage and assembly unit 240 for raw data direct output. Thus, the event-driven circuitry 130, implemented as an ASIC according to one exemplary embodiment, has an option to extract the data as outputs from the multi-channel ADC 135 before digital event processing. This feature optionally flashes out all data from the multi-channel ADC 135 at the second data rate (e.g., 6.4 Gbps).

The storage and assembly unit 240 may use an array of first-in-first-out (FIFO) buffers and a frame assembly utility (not shown). The storage and assembly unit 240 may be configured to provide the assembled data to a high rate output array interface 250, which including output drivers $250_1$-$250_N$ corresponding to the ADC units $200_1$-$200_N$. The output array interface 250 provides data outputs in differential CML 140 format. The storage and assembly unit 240 may use a clock signal 242 from a clock unit. 220, which receives as input a reference clock (REF_CLK) 212 (e.g., 200 MHz signal) and/or a CML clock 214 (e.g., 3.2 GHz signal) from a combinatorial logic 210.

The mode of operation of the multi-channel ADC 135 is defined by the clock unit. 220, and therefore, is based on receipt of the clock signal 242 representative of the reference clock signal frequency (e.g., 200 MHz) or the CML clock signal frequency, which is greater than the reference clock signal frequency by at least a factor of 10 (e.g., 3.2 GHz). In particular, responsive to receiving the clock signal 242 based on the CML clock 214, the multi-channel ADC 135 provides a first output 202 (e.g., data) to the storage and assembly unit 240 to send the CML output voltages and frequency 140 off chip. Similarly, responsive to receiving the clock signal 242 based on the reference clock 212, the multi-channel ADC 135 provides an output 204 (e.g., data output code 206 and clock signals 208) to a digital backend unit 260 for event detection, recording and sending data and clock signal 150 off chip.

According to one embodiment of the disclosure, as an alternative feature, upon receipt of the clock signal 242 associated with the reference clock frequency, the multi-channel ADC 135 may be set into a low energy consumption mode when there are no elements (e.g., photons) are present. In other words, the multi-channel ADC 135 is advantageously configured to work with flexible resolution which enables an option to operate at lower resolution during a silent period to save power. The silent period may be represented as the time period between detection of events (e.g., time period between photons, particle or ions striking the detector 110 of FIG. 1A or FIG. 1B). To avoid throttling, according to one embodiment of the disclosure, the multi-channel ADC 135 may require a prescribed period of time on non-activity (i.e. the number of events detected below the channel threshold 291 or no event detected at all) before lowering its resolution. The prescribed period may be programmable.

For example, in one embodiment, the resolution of each of the ADC units $200_1$-$200_N$ can be dropped from 12-bits to 8-bits during the silent period, which provides for a significantly lower power consumption over the N channels (e.g., N=32). Once an event (e.g., photon hit) is detected at 8-bit resolution, however, the resolution can be increased to 12-bit for streaming of data to the digital backend unit 260. The resolution may be reduced from 12-bits to 8-bits by automatic disabling of four (4) least significant bits (LSBs) during the silent period.

In one embodiment, each of the ADC units $200_1$-$200_N$ provides data and clock signals to the digital backend unit 260 for event detection, recording and sending data and clock signal 150 off chip. More specifically, according to one embodiment of the disclosure, each of the ADC units $200_1$, . . . , or $200_N$ of the multi-channel ADC 135 provides the digital output code 206 in response to an event detected at one or more detector cells or pixels associated with an ADC channel monitored by that ADC unit $200_1$, . . . , or $200_N$. The event may be represented by a voltage difference value produced in response to the event (e.g., a peak voltage) and optionally its associated clock signal 208. The digital backend unit 260 may be configured with a digital comparator (not shown), which receives the digital output code 206 and compares the digital output code 206 to a threshold signal value that also corresponds to a prescribed voltage difference value that signifies a voltage level that constitutes a detected event. The threshold signal value may be programmable or static.

Figure 2B:
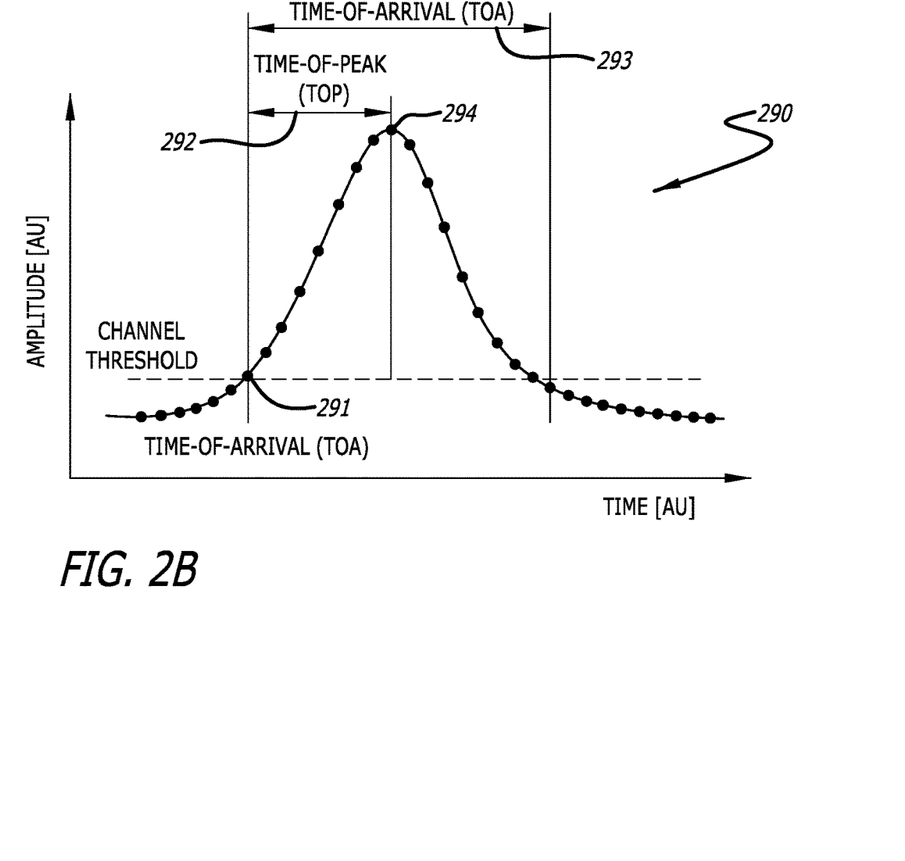
FIG. 2B is an exemplary representation of an analog signal representing different voltage amplitude as measured by an analog-to-digital converter (ADC) unit of a multi-channel ADC deployed within the event-driven circuitry of FIG. 2A.
Figure 2C:
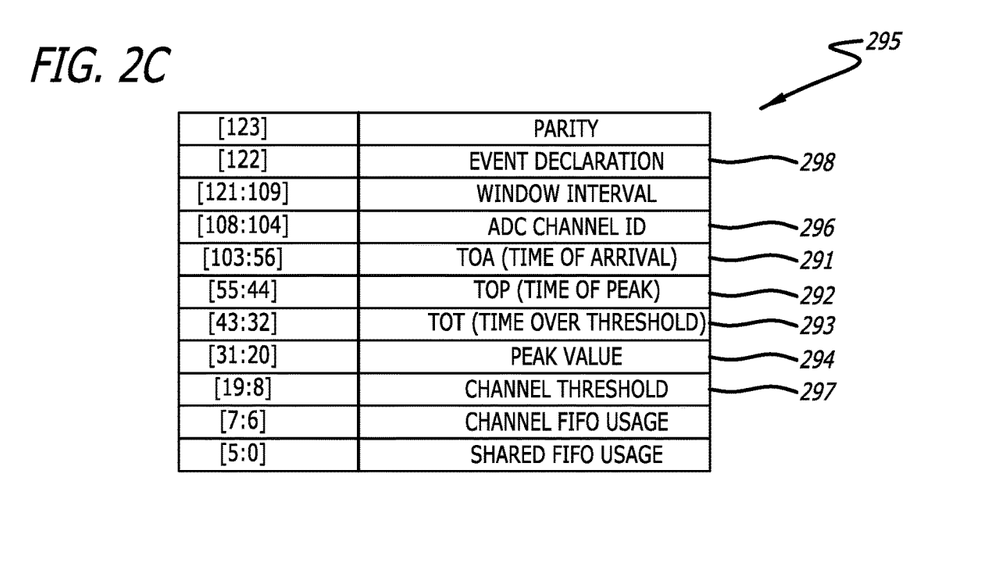
FIG. 2C is an exemplary representation of a data packet provided from the digital backend unit deployed within the event-driven circuitry of FIG. 2A.

When the output of any of the ADC units $200_1$-$200_N$ exceeds the threshold signal value to denote an event detected on detector pixels associate with its monitored ADC channel (e.g., ADC unit $200_1$), a timestamp is registered, and a peak (voltage) value of the data output code 206 provided by the ADC units $200_1$ is recorded. Otherwise, the data is not recorded and energy is saved. As shown in FIG. 2B, the data recorded from a signaling output 290 pertaining to an ADC channel, which is part of the amplified signals 125 as measured by a particular ADC unit (e.g., ADC unit $200_1$), may include, but is not limited or restricted to the following: TOA (time of arrival) 291, TOP (time of peak) 292, TOT (time over threshold) 293, and Peak Value 294. An output data packet 295, including the rest of the data generated by the digital backend unit 260, is collected for storage (locally or remotely) according to its channel settings, as shown in FIG. 2C. In particular, the time and magnitude-based measurements, other parameters may be recorded as part of the output data packet 295, including ADC channel identifier 296, ADC channel threshold 297 (especially if different ADC channels are provided different thresholds based on orientation of the detector, etc.), event declaration (e.g., signifying an event) 298, or the like.

Referring back to FIG. 2A, when the event is completed, the relevant information is assembled into the output data packet 295 provided as the data output (DATA1) 152. The digital backend unit 260 may produce output data packet 295 (e.g., a 124-bit data packet of FIG. 2C) using serial output interface at lower data rates (e.g., 50 Mbps) as only the more salient event-related data is buffered. The programmable logic 270 may be configured to output control bits for various components (not shown), including controlling the clock signals provided by the clock unit 220 at interfaces of the multi-channel ADC, the calibration unit 285, store and assembly unit 240, output array interface 250, and other components. Stated differently, in one embodiment, the programmable logic 270 includes a register map (or register bank) which is used to control different operations in this ASIC.

Figure 3:
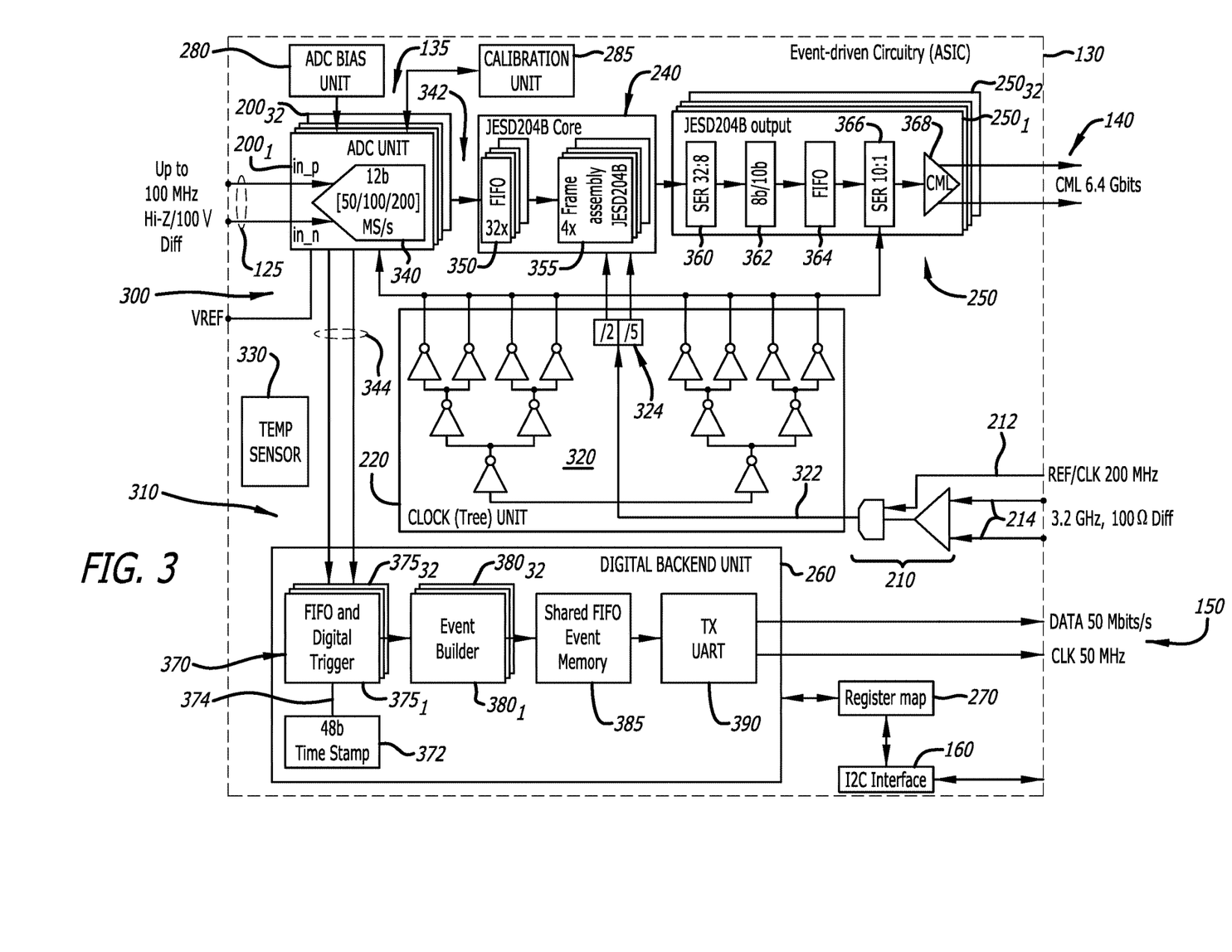
FIG. 3 is a detailed block diagram of the exemplary embodiment of the event-driven circuitry of FIG. 2A.

Referring now to FIG. 3, a detailed block diagram of the exemplary embodiment of the event-driven circuitry 130 of FIG. 2A is shown. The event-driven circuitry 130 is a mixed-signal design including both analog components 300 and digital components 310. According to one embodiment of the disclosure, the analog components 300 include 32 independent ADC units $200_1$-$200_{32}$, each configured to monitor an ADC channel of the multi-channel ADC 135. The analog components 300 further include the clock unit 220, which is configured to include featured as a clock buffer and clock distribution circuits (hereinafter, "clock tree 320") operating as the clock unit. 220 of FIG. 2A. The sampling frequency of each of the ADC units $200_1$-$200_{32}$ may be configured at 200 mega-samples per second (200 MS/s). However, the sampling frequency of each of the ADC units $200_1$-$200_{32}$ may be configured to be lower—e.g., 100 or 50 MS/s. The sampling frequency of 200 MS/s may be provided via a clock input 322, which is based on the reference clock (REF_CLK) 212 operating at 200 MHz and provided externally into the event-driven circuitry 130 via the combinatorial logic 210. The clock input 322 is processed through the clock tree 320 which ensures that there is no clock difference between any of channels supported by the ADC units $200_1$-$200_{32}$ (i.e., the external clock travels the same distance to get to all of the ADC units $200_1$-$200_{32}$). The ADC bias unit 280 is a top-level biasing circuit that may provide required reference voltages or currents for each ADC units to function.

Referring still to FIG. 3, some of the digital components 310 include at least the event-driven digital backend unit 260 and the calibration unit 285. According to one embodiment of the disclosure, calibrations of the ADC units $200_1$-$200_N$ may be performed automatically by an algorithm implemented in hardware. Recalibration of the ADC units $200_1$-$200_N$ may be performed based on temperature readings from a temperature sensor 330. The programmable logic 270, operating as a data register map utility, includes a list of registers with control bits that may be used to configure the multi-channel ADC 135—i.e., the data register map utility 270 may be programmed through the I2C/Register interface 160 to set, for example, the clock frequencies (50/100/200 MS/s) of the multi-channel ADC 135. The data register map utility 270 may further include a list of registers that may be used for configuring other components of the event-driven circuitry 130 such as components within the digital backend unit 260.

As an illustrative example, the calibration may be performed by the data register map utility 270 operating in concert with the calibration unit 285 by analyzing fabrication non-idealities or temperature impact based on the performance of each ADC channels associated with the ADC units $200_1$-$200_{32}$ and compensating for those non-idealities in each ADC channels. Each of the ADC units $200_1$-$200_{32}$ of the multi-channel ADC 135 may use a programmable sampling rate selector 340, which can be programmed for 200/100/50 MS/s, as show. Signals of up to half of the sampling rates can be digitized. For instance, at 200 MS/s, the input signal 125 of up to 100 MHz frequency can be digitized. So, where the amplified signal 125 is provided at faster frequencies, a higher sampling rate is required in which a lesser amount of power consumption is saved (e.g., a higher sampling rate tends to require higher power consumption). The sampling rate can be adjusted through changing the register data values maintained by the data register map utility 270.

As discussed above with reference to FIG. 2A, the data captured and digitized by each ADC channel of the multi-channel ADC 135 (e.g., each of the ADC units $200_1$-$200_{32}$) can be sent either (i) a first data path 342 or (ii) a second data path 344. The first data path 342 is directed to the CML output 140 via the storage and assembly unit 240 and output drivers $250_1$-$250_{32}$ operating as the output array interface 250. The second data path 344 is directed to the output 150 via the digital backend unit 260.

Herein, according to one embodiment of the disclosure, the storage and assembly unit 240 may employ FIFO memory 350 coupled to a frame assembly unit 355 to provide data in a recognizable format to the output drivers $250_1$-$250_{32}$. Each of the output drivers $250_1$-$250_{32}$ may include a resolution converter 360 and an 8b/10b encoder 362 that replaces 8-bits with 10-bit code. Each of the output drivers $250_1$-$250_{32}$ may further include a FIFO memory 364 for storing temporary data that is converted through encoder 366 that changes resolution to 10:1. Thereafter, the resultant data goes through CML 368 that generates the CML output 140 at the second data rate, for example, 6.4 Gbps.

In one embodiment, the first data path 342 utilizes a JESD204B interface, which reduces the number of interface lines, allowing for high system integration density. The event-driven circuitry 130 uses up to 16 CML lanes for JESD204B data output 140 (i.e. two ADC units per data lane). All lanes are operating at 6.4 Gbps data rate and can output the multi-channel ADC units $200_1$-$200_{32}$ data in real time. While the multi-channel ADC units $200i$-$200_{32}$ may be configured to sample input signals 125 at 200 MS/s, a frame assembly block 355 may feature several operating modes, which allow for a reduced number of lanes to be active. The frame assembly block 355 may digitally reduce the sampling frequency of the multi-channel ADC 135 by decimating samples by a multiple factor (e.g. 2 or 4), therefore, fewer CIVIL lanes are needed for a real time data transfer.

In one embodiment, in the digital backend unit 260, the data from each of the ADC units $200_1$-$200_{32}$ is monitored by a digital comparator 370 with a programmable threshold (hereinafter, "event-driven monitoring unit"). When any input from the ADC units $200_1$-$200_{32}$ exceeds a particular threshold (e.g., the digital output code 206 exceeds the threshold signal value for the event-driven monitoring unit $375_1$), a time stamp generator 372 generates a time stamp 374 associated with the digital output code 206. Thereafter, the digital output code 206 (representing the peak value of the input data) is recorded. The time and magnitude of each digital output code (i.e., detected peak voltage) is also recorded in a small per-channel FIFO and digital trigger array operating as the event-driven monitoring unit $375_1$. When the event is completed, the relevant information may be assembled into a packet by an event builder component $380_1$ . . . , or $380_N$ corresponding to the particular event-drive monitoring unit such as unit $375_1$) and output into a shared FIFO event memory 385 to be subsequently read out. The channel is then re-armed. As shown, the shared FIFO event memory 385 may provide data to a universal asynchronous receiver/transmitter (UART) 390. The UART 390 is circuitry responsible for implementing serial communication. Essentially, the UART 390 acts as an intermediary between parallel and serial interfaces. On one end of the UART 390 is a bus of several data lines (plus some control pins), on the other is the two serial wires—RX and TX. The TX serial wire may be used to output data 150.

According to the exemplary embodiments, the event-driven circuitry 130 can operate using one of the following clock sources: 200 MHz or 3.2 GHz. The combinatorial logic 210 features a two-stage selection scheme, which is configured to select its clock input 322 depending on how the multi-channel ADC 135 is to route data—i.e., the CML clock 214 for data being routed through the output array interface 250 (e.g., 3.2 GHz) over the first data path 342 or the reference clock 212 for data being routed through the digital backend unit (200 MHz) over the second data path 344.

Located inside the clock tree 320, one or more dividers 324 may be coupled to the combinatorial logic 210 to supply clock signals to components within the event-driven circuitry 130. In one embodiment, the main source of the clock is 200 MHz. However, the clock source of 3.2 GHz should be provided if the output array interface 250 (e.g., JESD204B output) is needed for direct output (i.e., real-time output) data from the multi-channel ADC 135. Each of the ADC units $200_1$-$200_{32}$ may have a local clock generator (not shown) to produce precise sampling and conversion time which are required for operation of the multi-channel ADC 135.

The event-driven circuitry 130 may deploy the temperature sensor 330. The operation temperature range for the exemplary event-driven circuitry 130 is −40° Celsius to +125° C. The multi-channel ADC 135 may operate using a reference voltage provided to the event-driven circuitry 130.

Figure 4:
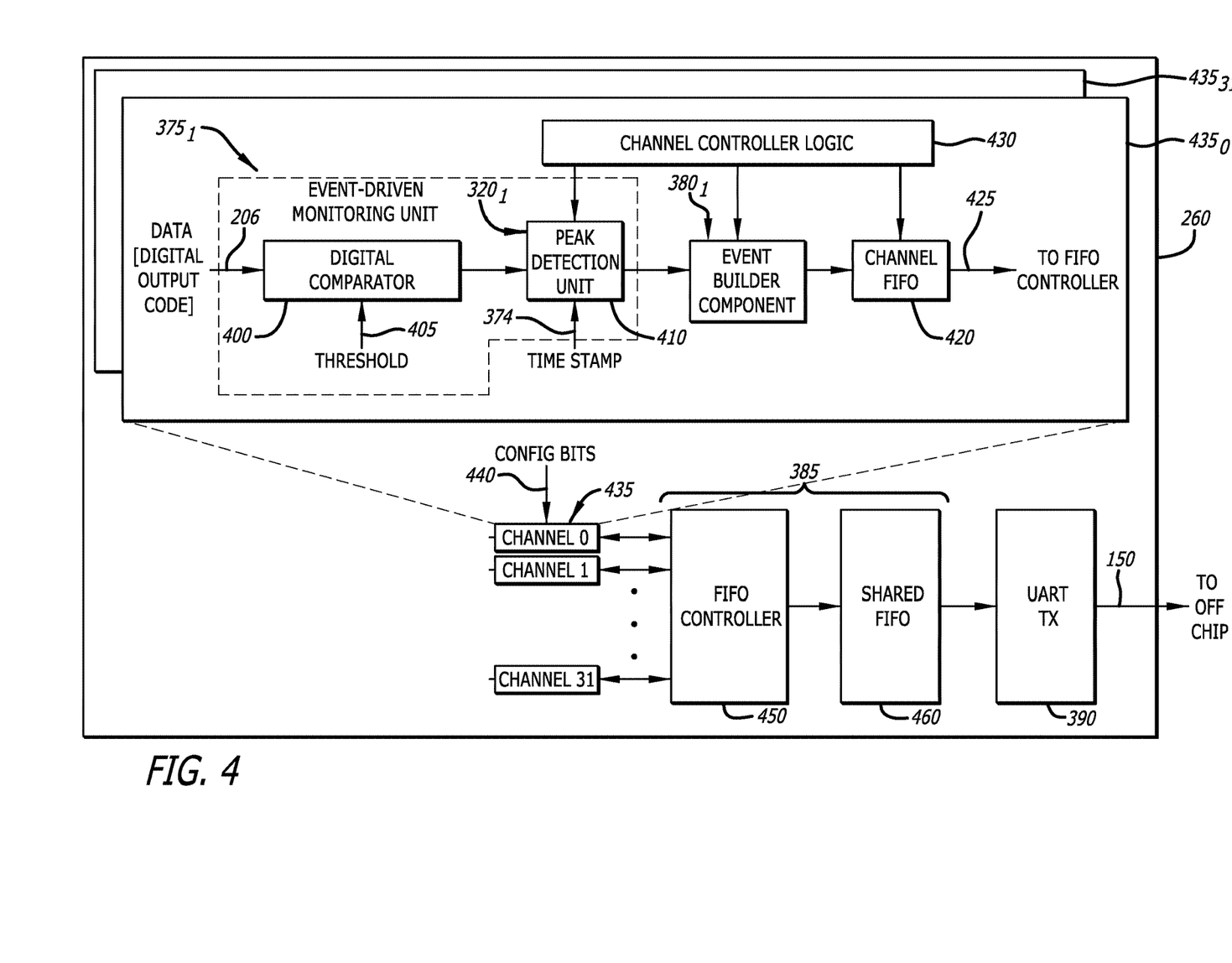
FIG. 4 is a block diagram of an event-driven portion of a digital backend, according to the exemplary embodiments.

Referring to FIG. 4, a block diagram of an event-driven portion of the digital backend unit 260, according to the exemplary embodiments. The input of each event-driven monitoring unit $375_1$-$375_N$ is provided from a corresponding ADC unit $200_1$-$200_N$, respectively. For clarity, the operability of the event-driven monitoring unit $375_1$ based on the receipt of the output digital code 206 from the ADC unit $200_1$ is shown. Herein, the event-driven monitoring unit $375_1$ features a digital comparator 400 and a peak detection unit 410. The digital comparator 400 monitors an input of the event-driven monitoring unit $375_1$ to determine, upon receipt of the output digital code 206, whether the code satisfies a programmable threshold 405. For example, when the digital output code 206 from the ADC units $200_1$ exceeds the threshold 405, the time stamp 374 (e.g., a 48-bit timestamp) is registered by the peak detection unit 410 of the event-driven monitoring unit $375_1$ depicted in FIG. 3, and the digital output code (representative of the peak value associated with the input signal 125 sampled by the ADC unit $200_1$) is recorded. In one embodiment, certain time/intensity/location parameters may be also recorded as illustrated in FIG. 2C.

When the event is completed, the relevant information is assembled into a packet by the event builder component $380_1$ and put into a channel FIFO 420. A channel controller logic 430 may control operations of the peak detection unit 410, the event builder block $380_1$ and the channel FIFO 420. The channel FIFO 420 may provide the packetized event-related data 425 to a FIFO controller 450 upon request processed by the channel controller logic 430. The FIFO controller 450 may be configured to control where to place data in a shared FIFO buffer 460. Note that the process performed by the event-driven portion of the digital backend unit 260 is executed for each of the channels 435 of the multi-channel ADC 135.

The channels 435 may receive configurations bits 440 from the event-driven portion of a digital backend unit 260. Each of the channels 435 has a local clock generator to produce precise sampling and conversion time which are for operation of the multi-channel ADC 135. The channels are reconfigured based on the configurations bits 440. At the same time, a read request may be made for the data to be read out from shared FIFO event memory 385, which includes the FIFO controller 450 and the shared FIFO 460. The FIFO controller 450 may provide for buffering per-channel data prior to storing the per-channel data in the shared FIFO 460. When the shared FIFO 460 is ready, the events may be are read out. The shared FIFO 460 may provide data to the UART 390. The UART 390 is a block of circuitry responsible for implementing serial communication. Essentially, the UART 390 may act as an intermediary between parallel and serial interfaces. On one end, the UART 390 has a bus of several data lines (plus some control pins), on the other end it has the two serial wires—RX and TX. The TX serial wire may be used to output the event data 150 to an external destination (e.g., off chip when the event-driven circuitry 130 is deployed as an ASIC).

Figure 5A:
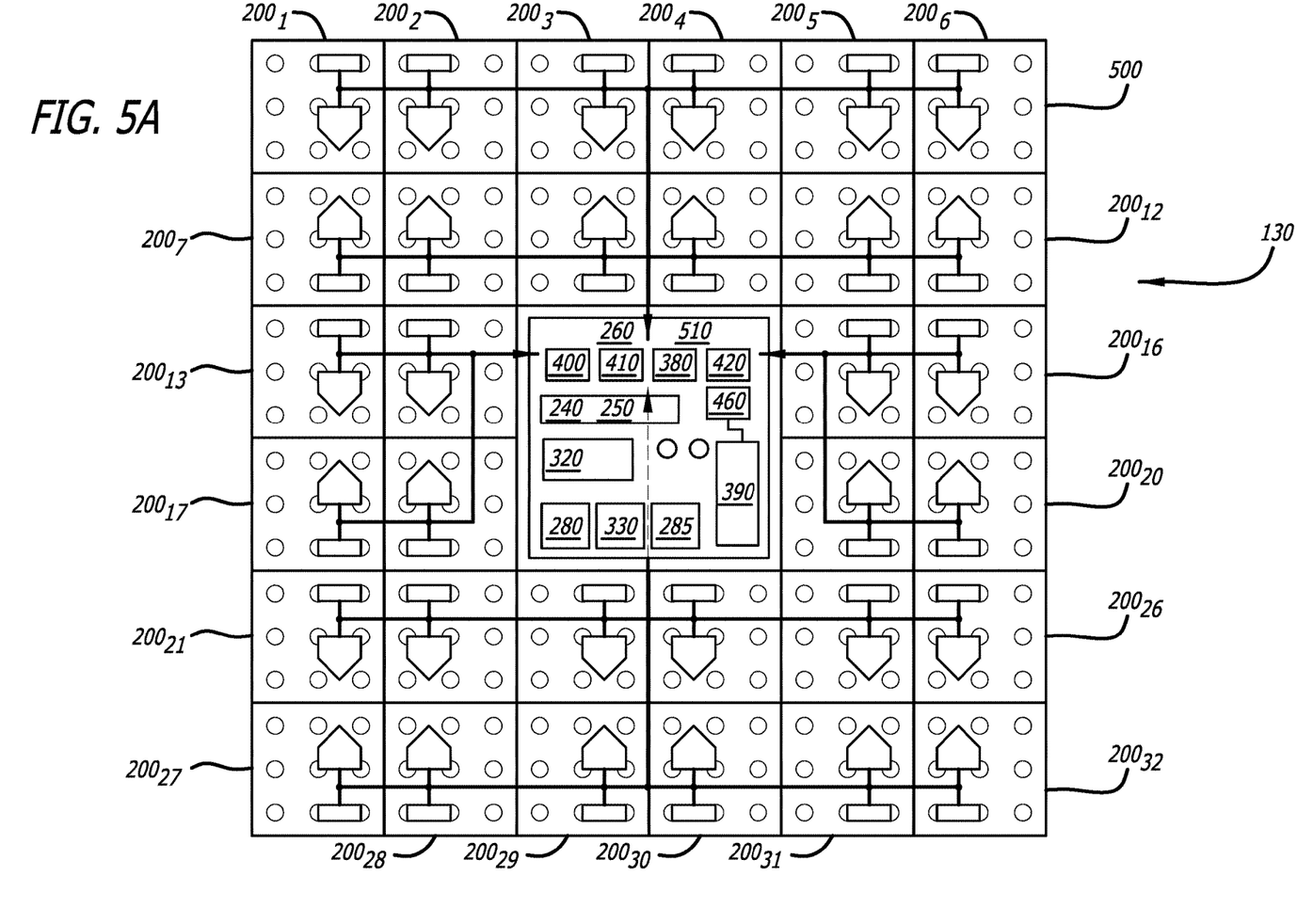
FIG. 5A is an exemplary diagram of a physical implementation of the event-driven circuitry of FIGS. 1-3 operating as an ASIC-based system.

Referring now to FIG. 5A, an exemplary diagram of a physical implementation of the event-driven circuitry 130 operating as an ASIC is shown. The ASIC 130 is implemented as an integrated circuit (ASIC) 500 with 32 independently operated ADC units $200_1$-$200_{32}$ placed equidistance from a center portion 510 of the ASIC 500. The equidistant location of the ADC units $200_1$-$200_{32}$ (i.e., ADC channels) provides for the same reference clock signal to be received by each of the channels with similar delays. The clock tree 320 discussed above with reference to FIG. 3 ensures that the clock signal travels the same distance to all of the ADC units $200_1$-$200_{32}$. The programmable sampling rate of 200/100/50 MS/s is provided with the input signal frequency <0.1 GHz. The ASIC 500 advantageously has a miniaturized size of approximately 2.79 millimeters (mm)× 2.79 mm. The ASIC 500 may have an integrated event-driven digital backend unit 260 located at the center portion 510 of the ASIC 500. Also, the store and assembly logic 240 is implemented at the center portion 510 of the ASIC 500. Additionally, the output array interface 250, the clock buffer (tree) 320, the temperature sensor 330, the ADC bias unit 280, and the calibration unit 285 may be implemented in the center portion of the ASIC 500 surrounded by the ADC units $200_1$-$200_{32}$. Out of these blocks, the clock tree 320 and the ADC bias unit 280 may be placed in the center portion 510 of the ASIC 500 so that the clock tree 320 provides the interconnect between components deployed within the center portion 510 and each of the ADC units $200_1$-$200_{32}$ (e.g., ADC channels).

Figure 5B:
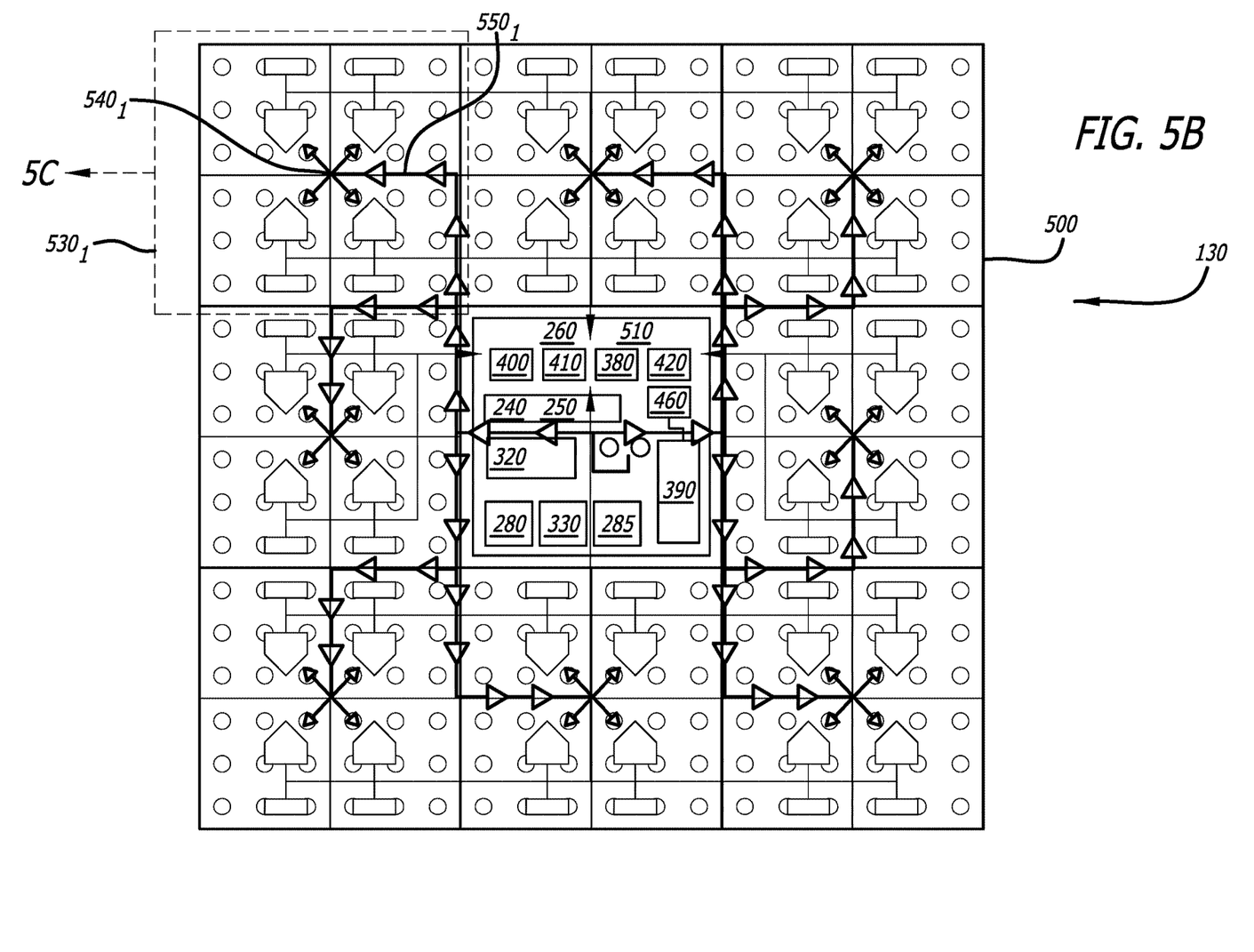
FIG. 5B is an exemplary diagram of a physical implementation and a clocking signal path of the ASIC of FIG. 5A.

Referring to FIG. 5B, an exemplary diagram of a physical implementation and a clocking signal path of the ASIC 500 of FIG. 5A is shown. As discussed above with reference to FIG. 5A, the ASIC 500 is implemented with 32 independently operated ADC units $200_1$-$200_{32}$ representative of the ADC channels placed equidistance from the center portion 510 of the ASIC 500. The ASIC 500 may have an integrated event-driven digital backend unit 260 located at the center portion 510 of the ASIC 500. Also, the store and assembly logic 240 may implemented at the center portion 510 of the ASIC 500 along with the output array interface 250, the clock unit 220 represented as the clock buffer (tree) 320, the temperature sensor 330, the ADC bias unit 280, and the calibration unit 285 may be implemented in the center portion 510 of the ASIC 500 as well.

As further shown in FIG. 5B, the arrowed lines illustrate the clock signaling flow as provided by the clock unit 220 throughout multi-channel ADC 135 (e.g., to each of the ADC units $200_1$-$200_{32}$) located within the ASIC 500. The ADC units $200_1$-$200_{32}$ are separated into eight (8) four-channel ADC cluster blocks, where a first four-channel ADC cluster block $530_1$ is illustrated in detail. As shown, the clock flow goes through the centers of each ADC cluster block, such as a center $540_1$ of the first ADC cluster block $530_1$. As discussed herein, this arrangement ensures that there is no clock difference between any of the ADC units $200_1$-$200_{32}$. As shown, each of the clock flows (e.g., clock flow $550_1$ supporting the first ADC cluster block $530_1$) features eight (8) clock buffers that impose latency on the clocking signal path. Also, the exemplary ASIC 500 may be used to read out event data from larger detector.

Figure 5C:
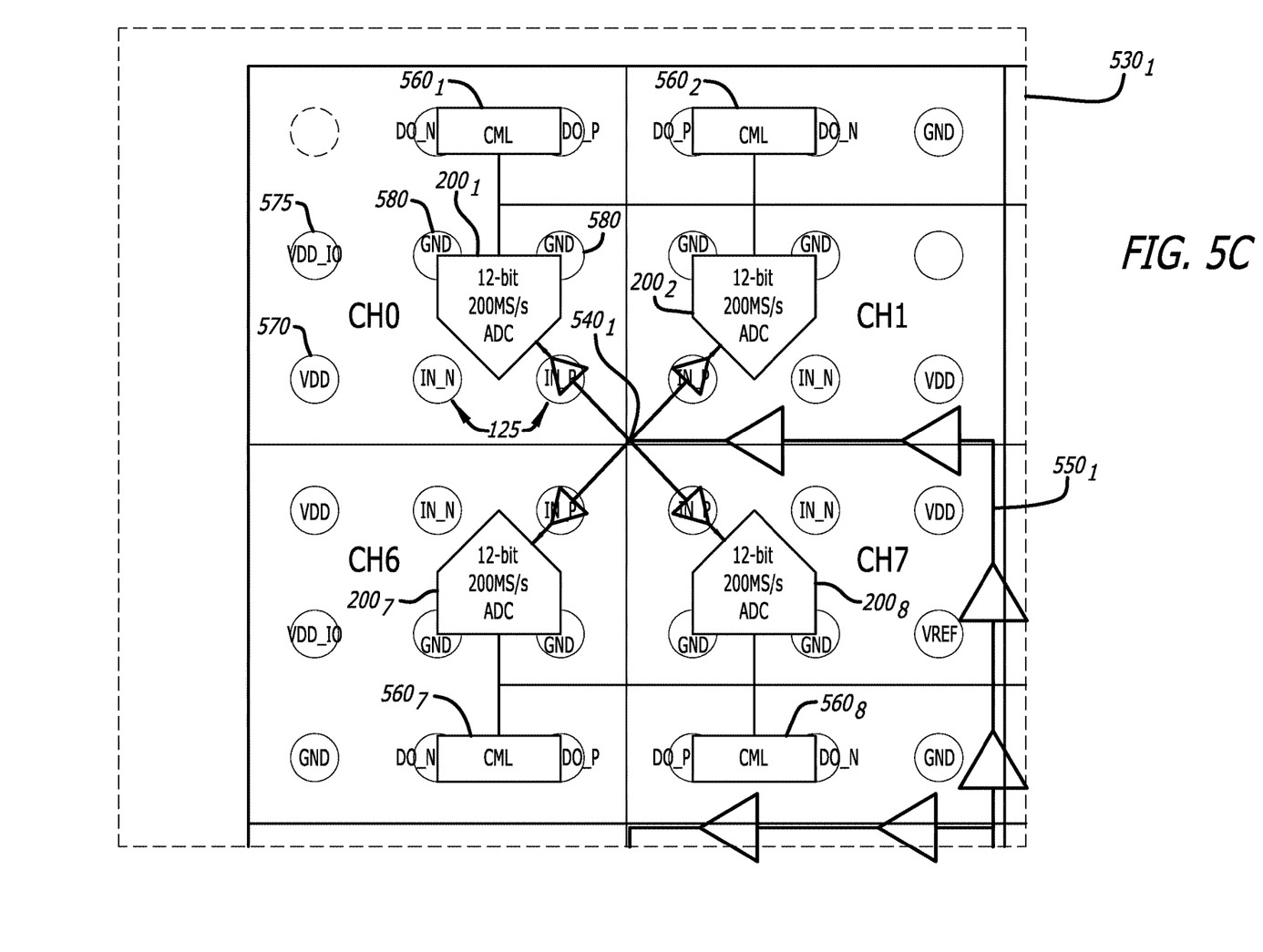
FIG. 5C is an exemplary block diagram and a functional flow of an exemplary ADC cluster block of FIG. 5B.

Referring to FIG. 5C, an exemplary block diagram and a functional flow of an exemplary ADC cluster block (e.g., the first ADC cluster block $530_1$) is shown, according to one exemplary embodiment. As discussed above with reference to FIG. 5B, the ASIC 500 is separated into eight ADC cluster blocks, including the first ADC cluster block $530_1$. Each of the channels CH0-CH1 & CH6-CH7 provides data from corresponding 12-bit ADC units $200_1$, $200_2$, $200_7$ and $200_8$ at the rate of 200 MS/s. A reference voltage pin (VREF) may be provided for the cluster block $530_1$. The VREF pin provides an input voltage used for the reference voltage. The voltage connected to this pin, along with the resolution of the ADC units $200_1$, $200_2$, $200_7$ and $200_8$ may dictate the step size. For a 12-bit ADC, the step size is VREF/4096, because it is a 12-bit ADC (i.e., 2 to the power of 12 defines 4096 steps). Each of the $200_1$, $200_2$, $200_7$ and $200_8$ communicates with a corresponding CML block $560_1$, $560_2$, $560_7$ and $560_8$. Each channel uses VDD and VDD_IO pins 570 and 575 that provide for core voltage and I/O interface voltages respectively. Each of the ADC units $200_1$, $200_2$, $200_7$ and $200_8$ has ground pins (GND) 580. The arrowed lines show that clock flow propagates through the center of the cluster block as, for the first ADC cluster block $530_1$, the clock flow $550_1$ propagates through the center $540_1$ of the cluster block $530_1$.

Figure 6:
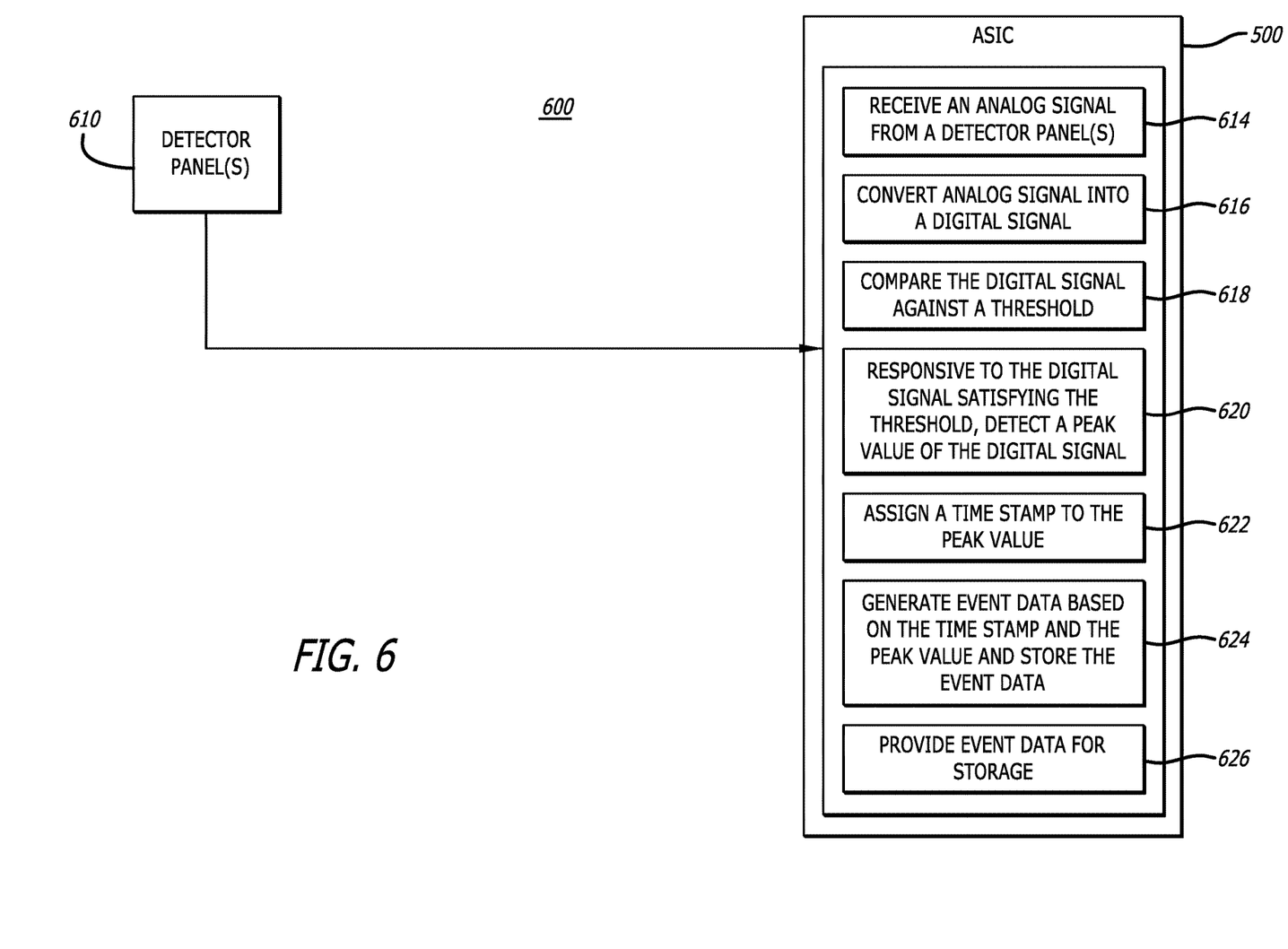
FIG. 6 is an exemplary diagram of event-driven circuitry implemented as an ASIC-based data acquisition system for photon detection from a LAPPD panel.

Referring now to FIG. 6, an exemplary diagram of event-driven circuitry implemented as an ASIC-based data acquisition system 600 is shown. Herein, the event-driven ASIC-based data acquisition system 600 includes the ASIC 500 of FIGS. 5A-5C connected to one or more detector panels ("detector panel(s)") 610. Herein, as an illustrative example, each detector panel 610 may include photon detector cells (e.g. 32 photon detector cells) which can be readily connected to the ASIC 500.

Herein, the ASIC 500 includes components in which the functionality of such components is enumerated and illustrated as part of the ASIC 500. It is contemplated that such functionality may be accomplished by the ASIC components described above, or perhaps other components such as a processor (e.g., or several microprocessors) and memory blocks including ROM, RAM, EEPROM, flash memory. It should be understood that the ASIC 500 may include additional components and that some of the components described herein may be removed and/or modified without departing from a scope of the ASIC 500 disclosed herein.

In one embodiment, the ASIC 500 may receive an analog signal from a detector 610 (block 614). The ASIC 500 may convert the analog signal into a digital signal (block 616). The ASIC 500 may compare the digital signal against a threshold (block 618). The ASIC 500 may, responsive to the digital signal satisfying the threshold, detect a peak value of the digital signal (block 620). The ASIC 500 may assign a time stamp to the peak value (block 622). The ASIC 500 may generate event data based on the time stamp and the peak value (block 624) and may store the event data (block 626).

In the foregoing description, the invention is described with reference to specific exemplary embodiments thereof. It will, however, be evident that various modifications and changes may be made thereto without departing from the broader spirit and scope of the invention as set forth in the appended claims.

What is claimed is:

1. A method of an event-driven data acquisition, the method comprising:
   determining a mode of operation by at least analyzing received external reference clock frequency data to determine whether the digital data is to be (i) compared against a threshold signal value or (ii) processed through a storage and assembly unit to provide data outputs in differential current mode logic (CIVIL) format;
   receiving an analog signal in response to detection of an event;

generating digital data based on the analog signal; and
responsive to the determining of the mode of operation where the digital data is to be compared against the threshold signal value,
  comparing the digital data against the threshold signal value,
  responsive to the digital data exceeding the threshold signal value to confirm the event, detecting a peak value of the digital signal and assigning a time stamp to the digital data,
  generating event data at least based on the time stamp and the peak value, and
  transmitting the event data for storage.

2. The method of claim 1, wherein the receiving of the analog signal is in response to detection of the event being a photon, particle or ion hitting a detector.

3. The method of claim 1, wherein the receiving of the analog signal comprises sampling of the analog signals by a plurality of analog-to-digital conversion units corresponding to a plurality of channels of a multi-channel analog-to-digital converter (ADC).

4. The method of claim 3, wherein the generating of the event data based on the time stamp and the peak value comprises generating the event data for each of the plurality of the channels of the multi-channel ADC.

5. The method of claim 4, further comprising combining the event data generated for each of the plurality of the channels of the multi-channel ADC.

6. The method of claim 5, further comprising processing the combined event data through a universal asynchronous receiver/transmitter unit prior to outputting the combined event data in a serial format.

7. The method of claim 1, further comprising responsive to the digital data falling below the threshold signal value, discarding the digital data.

8. An event-driven data acquisition system comprising:
at least one detector; and
an application specific integrated circuit (ASIC) communicatively coupled to the detector, the ASIC being configured to:
  determining a mode of operation by at least analyzing received external reference clock frequency data to determine whether the digital signal is to be processed through a digital comparator to be compared against the threshold or to be processed through a storage and assembly unit for a high-frequency raw data direct output, and
  receive an analog signal in response to detection of an event,
  generate digital data based on the analog signal,
  responsive to the determining of the mode of operation where the digital data is to be compared against the threshold signal value,
    compare the digital data against a threshold signal value,
    responsive to the digital data exceeding the threshold signal value to confirm the event, detect a peak value of the digital signal and assign a time stamp to the digital data,
    generate event data at least based on the time stamp and the peak value, and
    transmit the event data for storage.

9. The event-driven data acquisition system of claim 8, wherein the ASIC to receive the analog signal in response to the event being a photon, particle or ion hitting a detector panel.

10. The event-driven data acquisition system of claim 8, wherein the ASIC includes a multi-channel analog-to-digital converter (ADC) including a plurality of ADC units corresponding to a plurality of channels supported by the multi-channel ADC, each of the ADC units sampling the analog signal and generating the digital data.

11. The event-driven data acquisition system of claim 10, wherein the ASIC is further configured to generate the event data corresponding to event data for each of the plurality of the channels supported by the multi-channel ADC.

12. The event-driven data acquisition system of claim 11, wherein the ASIC is further configured to combine the event data generated for each of the plurality of the channels of the multi-channel ADC and to store the combined data in a data store.

13. The event-driven data acquisition system of claim 12, wherein the ASIC is further configured to provide the combined data from the data store to a universal asynchronous receiver/transmitter unit prior to outputting the combined data from the ASIC.

14. The event-driven data acquisition system of claim 8, wherein the ASIC is further configured to, responsive to the digital data failing to satisfy the threshold signal value, discard the digital data.

15. The event-driven data acquisition system of claim 10, wherein the ASIC is further configured to operate in a silent low-resolution mode while waiting for events.

16. The event-driven data acquisition system of claim 15, wherein the ADC units operate at a reduced resolution during the silent low-resolution mode.

17. The event-driven data acquisition system of claim 10, wherein the ASIC is implemented on a miniaturized chip comprising the plurality of ADC units independently operating and placed equidistance from a center of the ASIC to provide a clock signal with equivalent delays to each channel of the plurality of channels supported by the multi-channel ADC.

18. The event-driven data acquisition system of claim 17, wherein the center of the ASIC includes a digital backend unit including at least a digital comparator, a peak detection unit, a clock unit, and circuitry to generate data outputs in differential current mode logic (CIVIL) format.

19. The method of claim 1, wherein responsive to the determining of the digital signal is to be processed through the storage and assembly unit, providing CML data outputs associated with the digital data at a data rate greater than a hundred times of a data rate in generating the digital data being compared against the threshold signal value.

20. The event-driven data acquisition system of claim 8, wherein responsive to the determining of the digital signal is to be processed through the storage and assembly unit, providing CML data outputs associated with the digital data at a data rate greater than a data rate in generating the digital data being compared against the threshold signal value.

* * * * *